(12) United States Patent
Liao

(10) Patent No.: US 7,995,353 B2
(45) Date of Patent: Aug. 9, 2011

(54) CIRCUIT BOARD AND ELECTRONIC DEVICE USING THE SAME

(75) Inventor: Chang-Te Liao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 604 days.

(21) Appl. No.: 12/189,802

(22) Filed: Aug. 12, 2008

(65) Prior Publication Data
US 2009/0263983 A1   Oct. 22, 2009

(30) Foreign Application Priority Data
Apr. 22, 2008  (CN) .......................... 2008 1 0301231

(51) Int. Cl.
*H05K 3/00* (2006.01)
*H05K 3/30* (2006.01)
*H05K 3/40* (2006.01)

(52) U.S. Cl. ........ 361/767; 361/748; 361/760; 361/807; 361/808; 174/260; 174/261; 174/263; 257/737; 257/782; 257/784; 228/180.21; 29/830; 29/840; 29/852

(58) Field of Classification Search .......... 361/748–752, 361/760–767, 770, 771, 773–779, 788, 795, 361/796, 803, 807, 808, 820; 257/327, 459, 257/690–698, 686, 687, 688, 737, 729, 786, 257/782–784, 777, 779, E21.122, E23.02; 174/255, 254, 260–267; 228/179.1, 180.1, 228/180.21, 180.5; 29/522.1, 830–832, 840–852, 29/860, 879, 825
See application file for complete search history.

(56) References Cited

U.S. PATENT DOCUMENTS

| | | | | |
|---|---|---|---|---|
| 4,396,140 A * | 8/1983 | Jaffe et al. | ................. | 228/122.1 |
| 4,774,760 A * | 10/1988 | Seaman et al. | ................. | 29/840 |
| 5,241,134 A * | 8/1993 | Yoo | ............. | 174/94 R |
| 5,707,714 A * | 1/1998 | Furutatsu et al. | ............. | 428/209 |
| 5,978,229 A * | 11/1999 | Kim | ............................ | 361/760 |
| 6,196,871 B1 * | 3/2001 | Szu | ............................ | 439/571 |
| 6,259,038 B1 * | 7/2001 | Sakaguchi et al. | ........... | 174/261 |
| 6,316,736 B1 * | 11/2001 | Jairazbhoy et al. | ........... | 174/260 |
| 6,429,383 B1 * | 8/2002 | Sprietsma et al. | ........... | 174/260 |
| 6,791,845 B2 * | 9/2004 | Belopolsky | ................. | 361/760 |
| 7,271,439 B2 | 9/2007 | Park | | |
| 7,535,723 B2 * | 5/2009 | Belopolsky | ................. | 361/760 |
| 7,723,855 B2 * | 5/2010 | Tsai et al. | ..................... | 257/786 |

FOREIGN PATENT DOCUMENTS
JP       09139567 A  *  5/1997

* cited by examiner

*Primary Examiner* — Michail V Datskovskiy
(74) *Attorney, Agent, or Firm* — Frank R. Niranjan

(57) ABSTRACT

A circuit board includes four positioning pads placed on a surface of the circuit board, four positioning holes corresponding to the positioning pads, respectively, and a solder mask placed on the surface around the periphery of the positioning pads. An arc-shaped recess is defined at a side of each positioning pad near the corresponding positioning hole and the space between the edges of the positioning pad and the positioning hole ranges from 0.2 mm to 0.5 mm.

10 Claims, 3 Drawing Sheets

CIRCUIT BOARD AND ELECTRONIC DEVICE USING THE SAME

FIELD OF THE INVENTION

The present invention relates to surface mount technology (SMT) and, particularly, to a circuit board that can prevent solder from leaking onto an electronic device using the circuit board.

DESCRIPTION OF RELATED ART

In recent years, SMT has been widely used in electronic device manufacturing for mounting electronic elements to circuit boards. These electronic elements, such as resistors, capacitors, inductances and so on, are connected to a circuit board by pads.

The pads are correspondingly matched on the circuit board with leads of the electronic elements, including positioning leads. In order to accurately position the electronic elements, the circuit board usually has numerous positioning holes and positioning pads for matching positioning leads of the electronic elements. Each positioning hole should be placed near a positioning pad, wherein center-to-center spacing of the positioning hole and the positioning pad should be as small as possible. As a result, the positioning hole and the positioning pad are usually placed too close to each other, not allowing enough space between its edges. Therefore, solder printed on the positioning pad is prone to leak from the positioning hole when it begins to melt.

What is needed, therefore, is a circuit board that can accurately position the electronic element and prevent solder on the positioning pad from leaking, in addition to an electronic device using the circuit board.

SUMMARY

In accordance with one present embodiment, a circuit board includes a number of positioning pads placed on a surface of the circuit board, a number of positioning holes corresponding to the positioning pads, and a solder mask placed on the surface around the periphery of the positioning pads. An arc-shaped recess is defined at a side of each positioning pad near the adjacent positioning hole. The space between the edges of the positioning pad and the positioning hole ranges from 0.2 mm to 0.5 mm.

BRIEF DESCRIPTION OF THE DRAWINGS

Many aspects of the present circuit board and electronic device can be better understood with references to the following drawings. The components in the drawings are not necessarily drawn to scale, the emphasis instead being placed upon clearly illustrating the principles of the present circuit board and electronic device.

DETAILED DESCRIPTION

Embodiments of the present invention will now be described in detail with references to the drawings.

Figure 1:
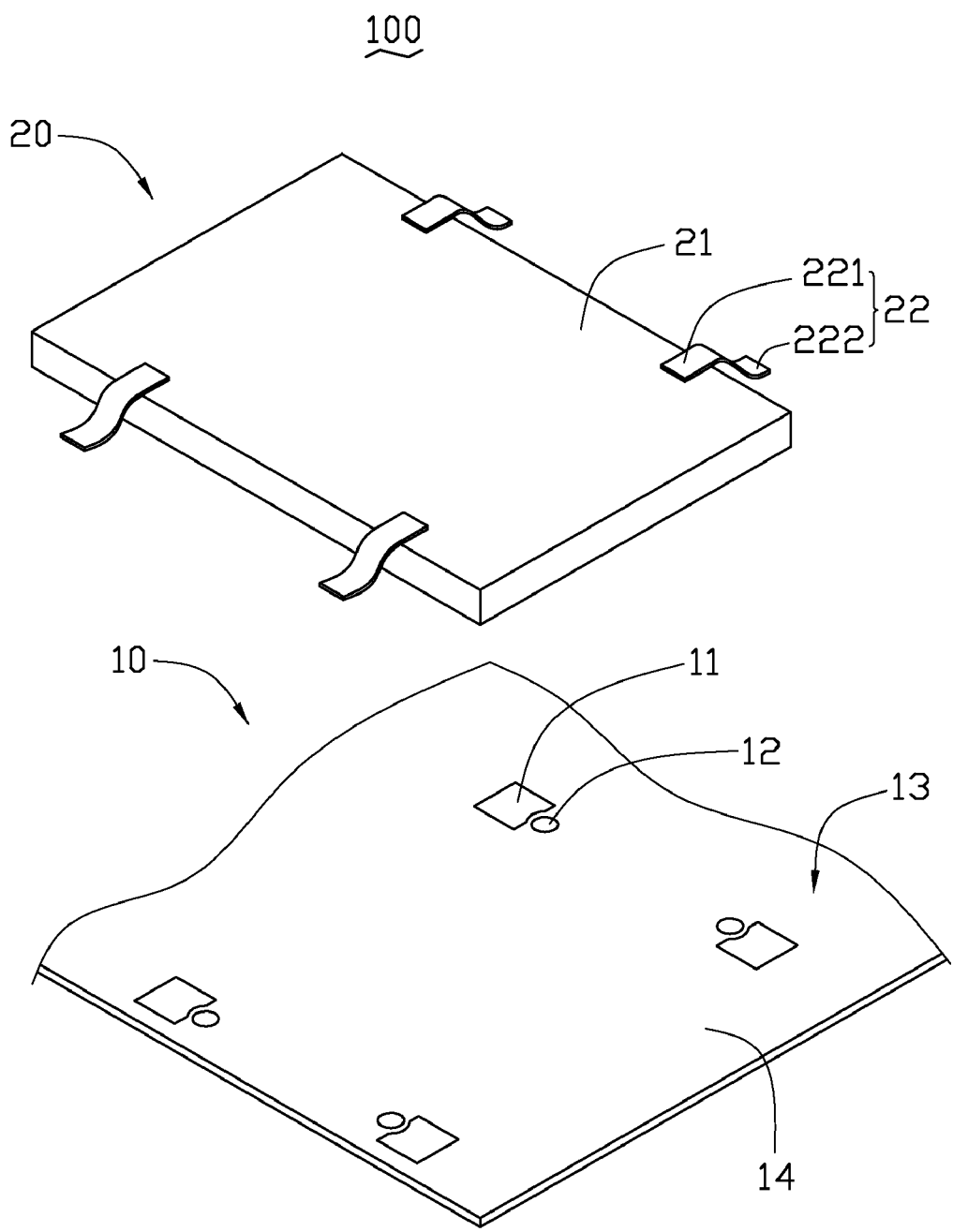
FIG. 1 is a schematic, exploded view of an electronic device according to an embodiment.
Figure 2:
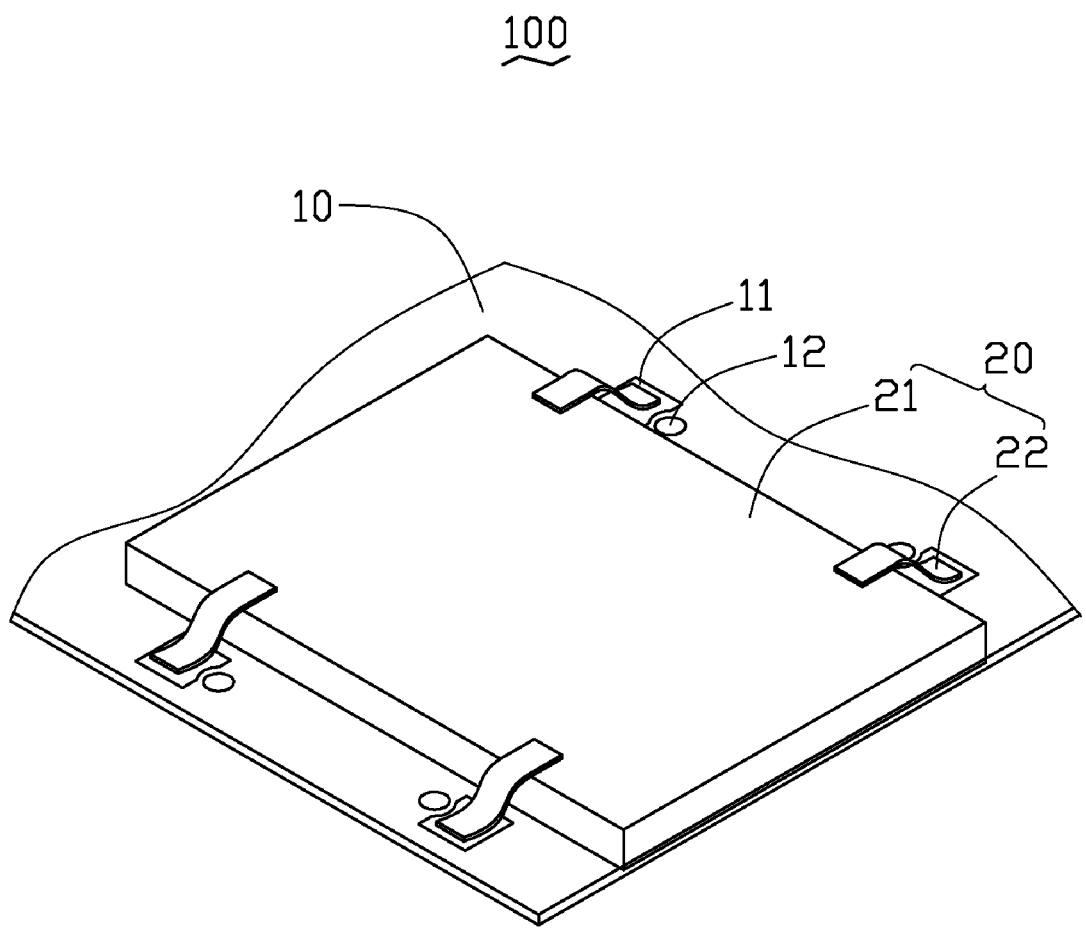
FIG. 2 is a schematic, assembled view of the electronic device of FIG. 1.

Referring to FIG. 1 and FIG. 2, an electronic device 100 according to a first embodiment includes a circuit board 10 and at least one electronic element 20 mounted on the circuit board 10. The circuit board 10 and the electronic element 20 are soldered in order to create an electrical connection.

The electronic element 20 can be a resistor, a capacitor, an integrated circuit, or an image sensor, among others. Preferably, the electronic element 20 should be accurately positioned on the circuit board 20. The electronic element 20 includes a main body 21 and a number of leads electrically or physically connected with the main body 21. The main body 21 has circuits sealed therein.

In the present embodiment, we only show positioning leads 22 of the electronic element 20 that correlates with our invention. The electronic element 20 has four positioning leads 22. Each lead 22 includes an extending portion 221 and a contact portion 222. The extending portion 221 extends from a surface of the main body 21 and is bent towards the bottom of the electronic element 20 with its distal end connecting with the contact portion 222. The contact portion 222 is essentially parallel with and can be soldered to the circuit board 10.

In the present embodiment, the circuit board 10 is a printed circuit board laminated with multiple layers of non-conductive material, having conductive traces sandwiched between the non-conductive material layers. A number of positioning pads 11 reside on a surface 13 of the circuit board 10 and are surrounded by a solder mask 14, which also resides on the surface 13 of the circuit board 10. The circuit board 10 also defines a number of positioning holes 12 corresponding to the positioning pads 11.

Figure 3:
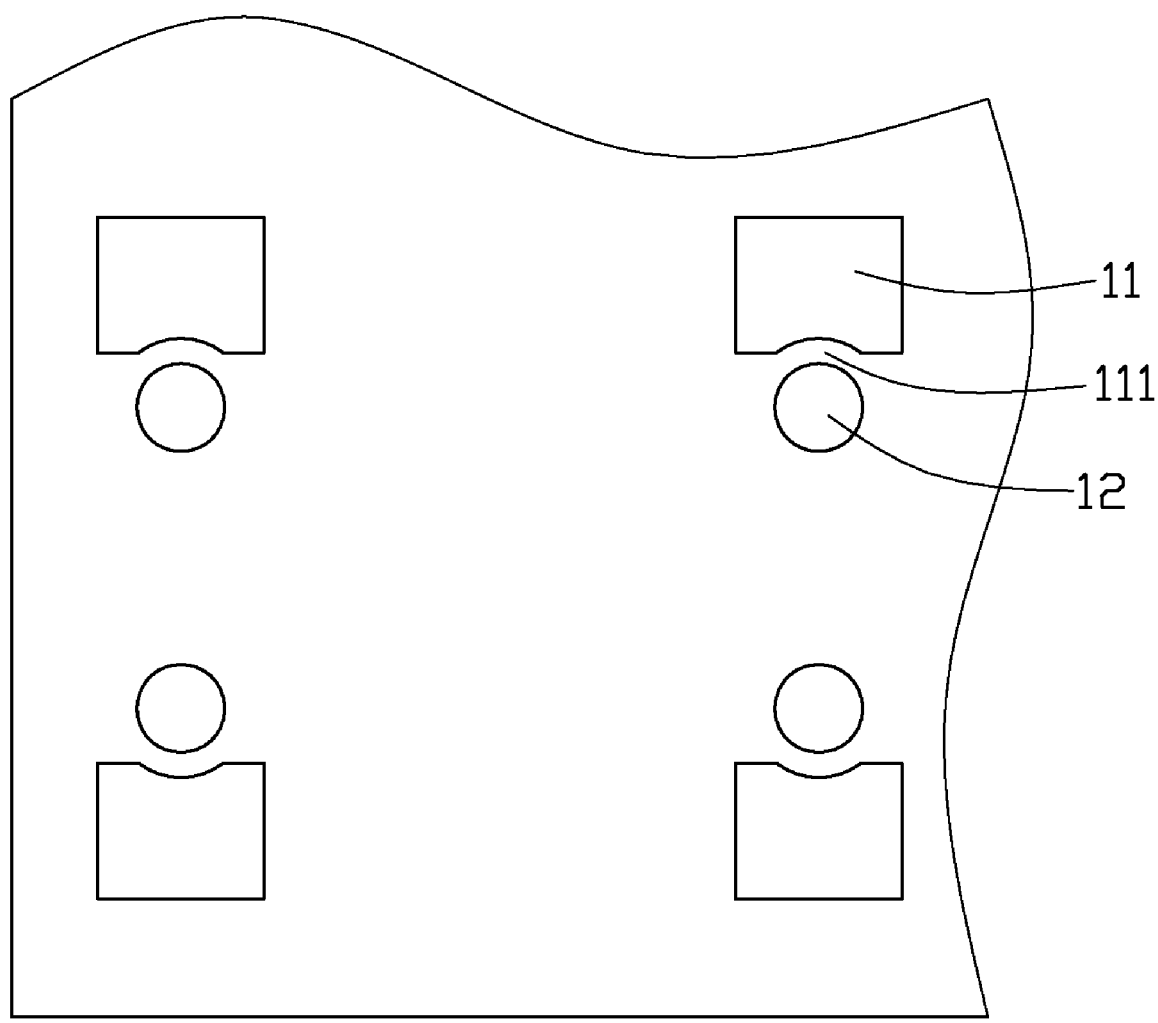
FIG. 3 is a schematic top plan view of a circuit board of FIG. 1.

Referring to FIG. 3, the positioning pads 11 correspond to the footprints of the contact portions 222 of the leads 22 and are configured for soldering the contact portions 222 thereon in order to connect the circuit board 10 and the electronic element 20. The positioning pads 11 can be formed on the circuit board 10 by methods such as chemical etching. In the present embodiment, the positioning pads 11 are generally quadrate-shaped and the positioning holes 12 are round. However, other shapes can be employed. An arc-shaped recess 111 is defined at a side of each positioning pad 11 near the corresponding positioning hole 12. Therefore, the positioning pad 11 and the positioning hole 12 can have a center-to-center spacing that is small enough to accurately position the electronic element 20, in addition to adequate spacing between its edges to prevent solder from leaking from the positioning hole 12. The space between the edges of the positioning pad 11 and the positioning hole 12 can range from 0.2 mm to 0.5 mm. In the present embodiment, the space between the edges of the positioning pad 11 and the positioning hole 12 is 0.3 mm. The recess 111 and the corresponding positioning hole 12 can be concentric.

The solder mask 14 extends around the periphery of the positioning pads 11 provided for the electronic element 20. Particularly, the material of the solder mask 12 can be solder-resistant, such as epoxide resin.

Since each positioning pad 11 of the circuit board 10 defines an arc-shaped recess at a side near the corresponding positioning hole 12, the center-to-center spacing of the positioning pad 11 and the positioning hole 12 can be reduced, maintaining adequate space between the edges. The circuit board 10 not only accurately positions the electronic element 20, it also prevents solder from leaking from the positioning hole 12.

While certain embodiments have been described and exemplified above, various other embodiments will be apparent to those skilled in the art from the foregoing disclosure. The present invention is not limited to the particular embodiments described and exemplified, but is capable of considerable variation and modification without departure from the scope of the appended claims.

What is claimed is:

1. A circuit board comprising:
   a plurality of positioning pads placed on a surface of the circuit board;
   a plurality of positioning hole adjacent to each positioning pads, respectively; and
   a solder mask placed on the surface around periphery of the positioning pads,
   wherein an arc-shaped recess is defined at a side of each positioning pad near the adjacent positioning hole and the space between the edges of the positioning pad and the positioning hole ranges from 0.2 mm to 0.5 mm.

2. The circuit board as claimed in claim 1, wherein the space between the edges of the positioning pad and the positioning hole is 0.3 mm.

3. The circuit board as claimed in claim 1, wherein the arc-shaped recess and the corresponding positioning hole are concentric.

4. The circuit board as claimed in claim 1, wherein each of the positioning pads is formed on the circuit board by chemical etching.

5. The circuit board as claimed in claim 1, wherein the solder mask is made of epoxide resin.

6. An electronic device comprising a circuit board and one or more electronic element mounted thereon, the circuit board comprising:
   a plurality of positioning pads placed on a surface of the circuit board;
   a plurality of positioning hole adjacent to each positioning pad; and
   a solder mask placed on the surface around periphery of the positioning pads,
   wherein an arc-shaped recess is defined at a side of each positioning pad near the adjacent positioning hole and the space between the edges of the positioning pad and the positioning hole ranges from 0.2 mm to 0.5 mm.

7. The electronic device as claimed in claim 6, wherein the space between the edges of the positioning pad and the positioning hole is 0.3 mm.

8. The electronic device as claimed in claim 6, wherein the arc-shaped recess and the corresponding positioning hole are concentric.

9. The electronic device as claimed in claim 6, wherein each of the positioning pads is formed on the circuit board by chemical etching.

10. The electronic device as claimed in claim 6, wherein the solder mask is made of epoxide resin.

* * * * *